(12) United States Patent
Chow et al.

(10) Patent No.: US 8,183,675 B2
(45) Date of Patent: *May 22, 2012

(54) INTEGRATED CIRCUIT PACKAGE-ON-PACKAGE SYSTEM WITH ANTI-MOLD FLASH FEATURE

(75) Inventors: Seng Guan Chow, Singapore (SG); Heap Hoe Kuan, Singapore (SG); Linda Pei Ee Chua, Singapore (SG)

(73) Assignee: Stats Chippac Ltd., Singapore (SG)

( * ) Notice: Subject to any disclaimer, the term of this patent is extended or adjusted under 35 U.S.C. 154(b) by 507 days.

This patent is subject to a terminal disclaimer.

(21) Appl. No.: 11/947,303

(22) Filed: Nov. 29, 2007

(65) Prior Publication Data
US 2009/0140407 A1 Jun. 4, 2009

(51) Int. Cl.
*H01L 21/02* (2006.01)
(52) U.S. Cl. . 257/685; 257/686; 257/723; 257/E21.504; 257/E23.123; 257/E23.169
(58) Field of Classification Search ........... 257/680–689
See application file for complete search history.

(56) References Cited

U.S. PATENT DOCUMENTS

| | | |
|---|---|---|
| 6,452,268 B1 | 9/2002 | Huang |
| 6,870,274 B2 | 3/2005 | Huang |
| 6,995,448 B2 | 2/2006 | Lee et al. |
| 6,998,721 B2 | 2/2006 | Zhou |
| 7,192,798 B2 | 3/2007 | Okada et al. |
| 7,566,966 B2 * | 7/2009 | Chow et al. ............ 257/723 |
| 2005/0260795 A1* | 11/2005 | Park et al. ............ 438/111 |
| 2006/0244157 A1* | 11/2006 | Carson ............ 257/787 |
| 2009/0057863 A1 | 3/2009 | Chow et al. |

* cited by examiner

*Primary Examiner* — Michael Lebentritt
(74) *Attorney, Agent, or Firm* — Ishimaru & Associates LLP; Mikio Ishimaru; Stanley Chang (57) ABSTRACT

An integrated circuit package-on-package system includes: mounting an integrated circuit package system having a mountable substrate over a package substrate with the mountable substrate having a mold structure; forming a package encapsulation having a recess over the package substrate and the integrated circuit package system. The present invention also includes: forming an anti-mold flash feature with an extension portion of the package encapsulation and constrained by the mold structure at the bottom of the recess, and partially exposing the mountable substrate in the recess with the anti-mold flash feature formed with the mold structure; and mounting an integrated circuit device over the mountable substrate in the recess.

20 Claims, 4 Drawing Sheets

& # x 2 0 ; # INTEGRATED CIRCUIT PACKAGE-ON-PACKAGE SYSTEM WITH ANTI-MOLD FLASH FEATURE

CROSS-REFERENCE TO RELATED APPLICATION

The present application contains subject matter related to U.S. patent application Ser. No. 11/850,197 filed Sep. 5, 2007, now U.S. Pat. No. 7,566,966, which is assigned to STATS ChipPAC Ltd.

TECHNICAL FIELD

The present invention relates generally to an integrated circuit package-on-package system and more particularly to an encapsulated integrated circuit package-on-package system.

BACKGROUND ART

In order to interface an integrated circuit with other circuitry, it is common to mount it on a lead frame or substrate. Each integrated circuit has bonding pads that are individually connected to the substrate's contact or terminal pads using extremely fine gold or aluminum wires or conductive balls, such as solder balls. The assemblies are then packaged by individually encapsulating them in molded plastic or ceramic bodies to create an integrated circuit package.

Integrated circuit packaging technology has seen an increase in the number of integrated circuits mounted on a single circuit board or substrate. The new packaging designs are more compact form factors, such as the physical size and shape of a packaged integrated circuit, and providing a significant increase in overall integrated circuit density.

However, integrated circuit density continues to be limited by the "real estate" available for mounting individual integrated circuits on a substrate. Even larger form factor systems, such as personal computers (PC's), compute servers, and storage servers, need more integrated circuits in the same or smaller "real estate". Particularly acute, the needs for portable personal electronics, such as cell phones, digital cameras, music players, personal digital assistants (PDA's), and location-based devices, have further driven the need for increased integrated circuit density.

This increased integrated circuit density has led to the development of multi-chip packages in which more than one integrated circuit can be packaged. Each package provides mechanical support for the individual integrated circuits and one or more layers of interconnect lines that enable the integrated circuits to be connected electrically to surrounding circuitry.

Current multi-chip packages, also commonly referred to as multi-chip modules, typically consist of a printed circuit board (PCB) substrate onto which a set of separate integrated circuit components are directly attached. Such multi-chip packages have been found to increase integrated circuit density and miniaturization, improve signal propagation speed, reduce overall integrated circuit size and weight, improve performance, and lower costs—all primary goals of the computer industry.

Multi-chip packages whether vertically or horizontally arranged, can also present problems because they usually must be pre-assembled before the integrated circuit and integrated circuit connections can be tested. Thus, when integrated circuits are mounted and connected in a multi-chip module, individual integrated circuits and connections cannot be tested individually, and it is not possible to identify known-good-die ("KGD") before being assembled into larger circuits. Consequently, conventional multi-chip packages lead to assembly process yield problems. This fabrication process, which does not identify KGD, is therefore less reliable and more prone to assembly defects.

Moreover, vertically stacked integrated circuits in typical multi-chip packages can present problems beyond those of horizontally arranged integrated circuit packages, further complicating the manufacturing process. It is more difficult to test and thus determine the actual failure mode of the individual integrated circuits. Moreover, the substrate and integrated circuit are often damaged during assembly or testing, complicating the manufacturing process and increasing costs.

For both vertical and horizontal multi-chip packages, assembly of the multi-chip packages must have reliable electrical and mechanical attachments between the multiple integrated circuits, the stacked packaged integrated circuits, or a combination thereof. For example, the encapsulating process for forming the packaged integrated circuit may cause contamination, such as mold flash or bleed, impeding reliable attachments.

Thus, a need still remains for an integrated circuit package-on-package system providing low cost manufacturing, improved yield, improved reliability, and greater flexibility to offer more functionality and fewer footprints on the printed circuit board. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package-on-package system including: mounting an integrated circuit package system having a mountable substrate over a package substrate with the mountable substrate having a mold structure; forming a package encapsulation having a recess over the package substrate and the integrated circuit package system. The present invention also includes: forming an anti-mold flash feature with an extension portion of the package encapsulation and constrained by the mold structure at the bottom of the recess, and partially exposing the mountable substrate in the recess with the anti-mold flash feature formed with the mold structure; and mounting an integrated circuit device over the mountable substrate in the recess.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Figure 1:
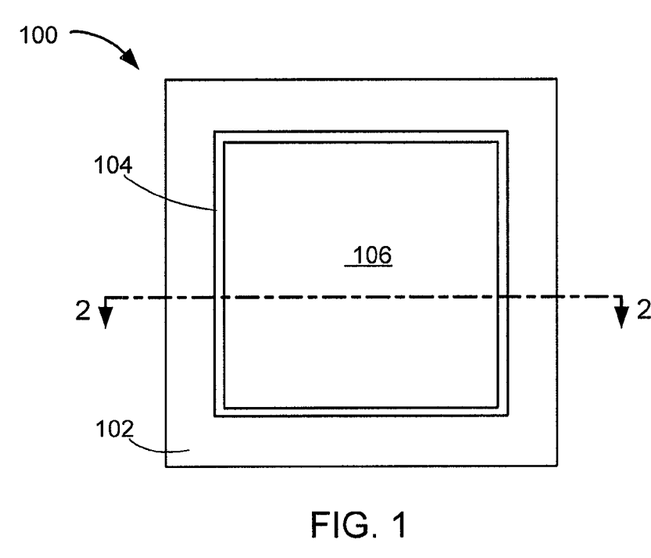
FIG. 1 is a top view of an integrated circuit package-on-package system in a first embodiment of the present invention.

Referring now to FIG. 1, therein is shown a top view of an integrated circuit package-on-package system 100 in a first embodiment of the present invention. The top view depicts a mountable integrated circuit package system 102, such as an integrated circuit package system, having a recess 104. An integrated circuit device 106, such as an integrated circuit package system or an integrated circuit die, may mount over the mountable integrated circuit package system 102 and in the recess 104.

For illustrative purposes, the recess 104 is shown extending beyond the horizontal dimensions of the integrated circuit device 106, although it is understood that the length and width of the integrated circuit device 106 may extend beyond a horizontal dimension of the recess 104. Also for illustrative purposes, the integrated circuit package-on-package system 100 is shown having one device or the integrated circuit device 106 mounted over the mountable integrated circuit package system 102, although it is understood that the multiple devices of similar or dissimilar types, technologies, functions, or a combination thereof may mounted over the mountable integrated circuit package system 102.

Figure 2:
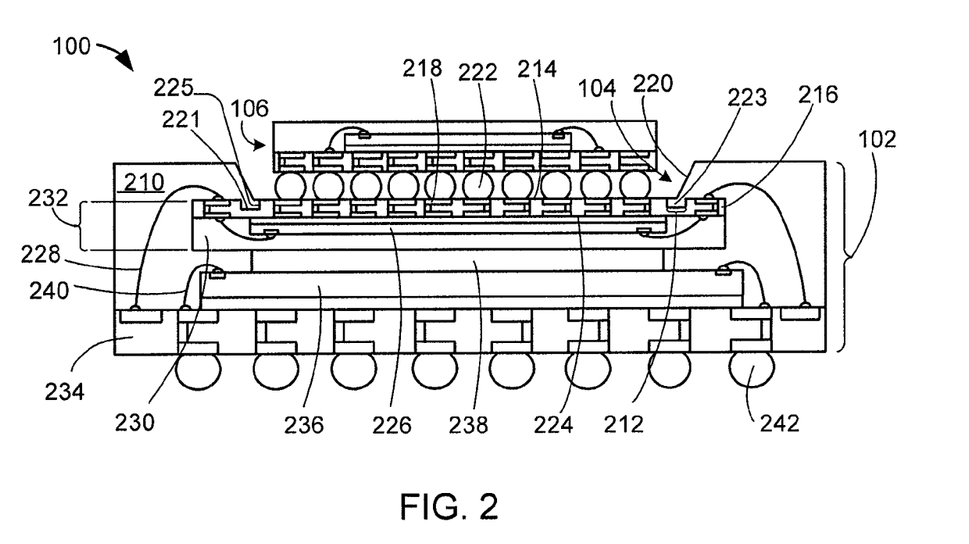
FIG. 2 is a cross-sectional view of the integrated circuit package-on-package system along line 2-2 of FIG. 1.

Referring now to FIG. 2, therein is shown a cross-sectional view of the integrated circuit package-on-package system 100 along line 2-2 of FIG. 1. As mentioned in FIG. 1, the integrated circuit device 106 preferably mounts over the mountable integrated circuit package system 102 and within the recess 104. The recess 104 is formed in a package encapsulation 210, such as an epoxy molding compound, of the mountable integrated circuit package system 102.

The package encapsulation 210 includes anti-mold flash features 212 at the innermost portions of the recess 104. The anti-mold flash features 212 is coplanar with a first surface 214 of a mountable substrate 216, such as a laminated substrate or a redistribution structure exposed by the recess 104, without covering or contaminating the exposed portions of contact pads 218 of the mountable substrate 216. The package encapsulation 210 may provide the recess 104 with a sloped portion 220 continuing to grooves 221 in the mountable substrate 216.

The anti-mold flash features 212 include the grooves 221 and an extension portion 223 of the package encapsulation 210 abutted to a vertical or non-horizontal side 225 of the mountable substrate 216 in the grooves 221 to form an inner extent of the package encapsulation at the bottom of the recess 104. The anti-mold flash features 212 also serve as mold lock feature improving the adhesion of the package encapsulation 210 with the mountable substrate 216. For illustrative purposes, the package encapsulation 210 is shown providing the recess 104 with the sloped portion 220, although it is understood that the recess 104 may be formed from with different geometric configuration, such as a vertical step configuration to the anti-mold flash features 212.

The integrated circuit device 106 preferably includes electrical connectors 222, such as solder balls. The electrical connectors 222 may attach with the contact pads 218 exposed in the recess 104 connecting the integrated circuit device 106 and the mountable integrated circuit package system 102. The anti-mold flash features 212 do not impede the connections between the electrical connectors 222 and the mountable substrate 216.

A second surface 224 of the mountable substrate 216 is preferably attached to a first integrated circuit 226, such as an integrated circuit die. The first integrated circuit 226 preferably mounts and electrically connects to the second surface 224 of the mountable substrate 216. The first integrated circuit 226 is preferably encapsulated with an inner encapsulation 230, such as an epoxy molding compound, forming a first integrated circuit package system 232.

A package substrate 234, such as a laminated substrate or a printed circuit board, may have a second integrated circuit 236, such as an integrated circuit die, mounted thereover. First electrical interconnects 228, such as bond wires or ribbon bond wires, may connect the first surface 214 of the mountable substrate 216 and the package substrate 234.

A spacer 238, such as a silicon spacer or film spacer, may be between the first integrated circuit package system 232 and the second integrated circuit 236. The spacer 238 may serve a number of functions. For example, the spacer 238 may provide clearance for second electrical interconnects 240, such as bond wires or ribbon bond wires, connecting the second integrated circuit 236 and the package substrate 234.

The package encapsulation 210 is preferably formed over the package substrate 234 covering the second integrated circuit 236, the spacer 238, the first electrical interconnects 228, and the second electrical interconnects 240. The package encapsulation 210 partially covers the first integrated circuit package system 232 exposing the mountable substrate 216. External interconnects 242, such as solder balls, preferably are mounted below the package substrate 234.

Figure 3:
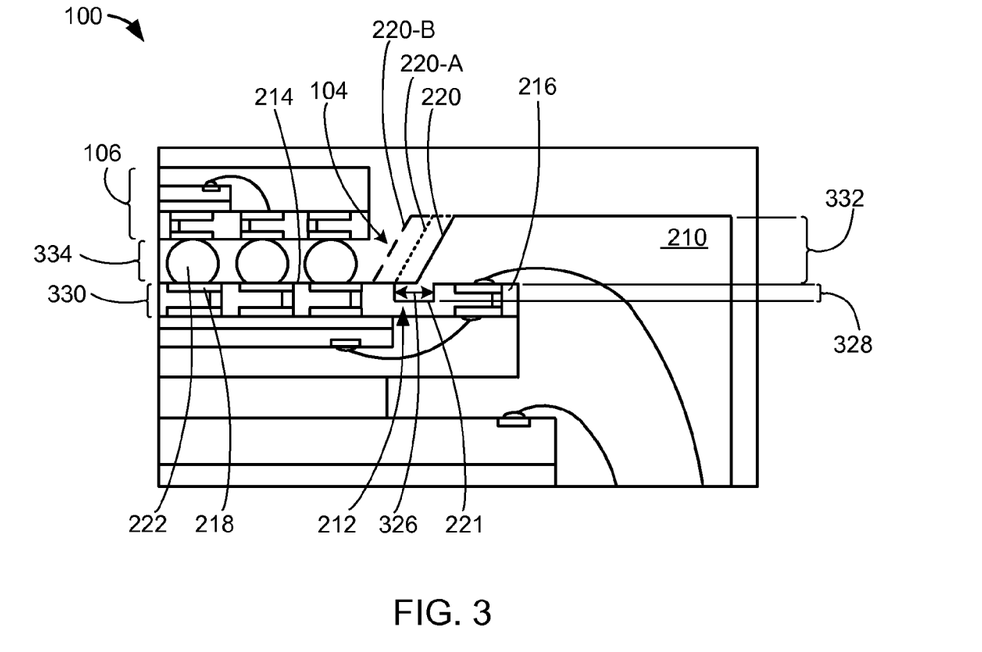
FIG. 3 is a more detailed cross-sectional view of a portion of the integrated circuit package-on-package system of FIG. 2.

Referring now to FIG. 3, therein is shown a more detailed cross-sectional view of a portion of the integrated circuit package-on-package system 100 along line 2-2 of FIG. 1. The more detailed cross-sectional view depicts the anti-mold flash features 212 including the grooves 221 formed from the first surface 214 of the mountable substrate 216 at the bottom portion of the recess 104. The grooves 221 include a groove width 326 and a groove height 328, wherein the groove height 328 is less than a substrate height 330 of the mountable substrate 216.

As an example, the sloped portion 220 extends partially over the grooves 221 of the anti-mold flash features 212 having a portion of the anti-mold flash features 212 exposed in the recess 104 and a portion of the anti-mold flash features 212 covered with the package encapsulation 210. As mentioned earlier, the anti-mold flash features 212 may be below the mountable substrate 216 without impeding the contact pads 218 exposed in the recess 104 and without covering or contaminating the exposed portions of the contact pads 218 of the mountable substrate 216.

The electrical connectors 222 have a connector height 334 above the mountable substrate 216. The package encapsulation 210 adjacent to the recess 104 may have a recess height 332 above the mountable substrate 216. The recess height 332 may be greater than the connector height 334. For illustrative purposes, the integrated circuit package-on-package system 100 is shown having the recess height 332 greater than the connector height 334, although it is understood that the recess height 332 may not be greater than the connector height 334. For example, the recess height 332 may be less than the connector height 334 with the integrated circuit device 106 extending beyond the recess 104.

A second configuration example of the anti-mold flash features 212 has a sloped portion 220-A, depicted by dotted lines, extending over the grooves 221 or the sloped portion 220-A covers the grooves. The anti-mold flash features 212 are formed below the sloped portion 220-A and in the grooves 221.

A third configuration example of the anti-mold flash features 212 has a sloped portion 220-B, depicted by dashed lines, extending beyond the grooves 221. The anti-mold flash features 212 are formed below the sloped portion 220-B and in the grooves 221. Although the sloped portion 220-B extends beyond the grooves 221, the grooves 221 alleviate molding pressure at the region forming the sloped portion 220-B thereby reducing or eliminating mold flashing of the contact pads 218 exposed in the recess 104.

For illustrative purposes, the anti-mold flash features 212 are shown having a coplanar configuration, although it is understood that the anti-mold flash features 212 may have different configurations. In another example, not shown, the anti-mold flash features 212 may be formed in a multi-stepped configuration. Further, the anti-mold flash features 212 may have the different configurations throughout the boundary at multiple locations of the package encapsulation 210 in the recess 104.

It has been discovered that the anti-mold flash features prevent molding compound from bleeding over the mountable substrate during encapsulation process. The anti-mold flash features extending below the first surface and into the grooves of the mountable substrate may provide mold locking functions so as to improve the mold adhesion between the molding compound and interposer edges.

Figure 4:
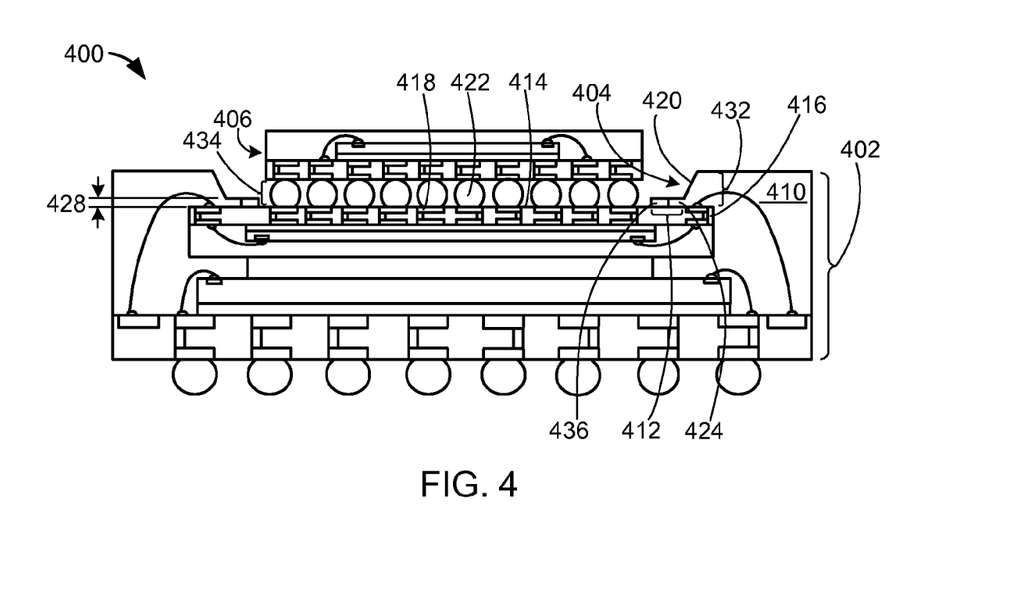
FIG. 4 is a cross-sectional view of an integrated circuit package-on-package system exemplified by the top view of FIG. 1 in a second embodiment of the present invention.

Referring now to FIG. 4, therein is shown a cross-sectional view of an integrated circuit package-on-package system 400 exemplified by the top view of FIG. 1 in the second embodiment of the present invention. The integrated circuit package-on-package system 400 includes structural similarities to the integrated circuit package-on-package system 100 of FIG. 2. The cross-sectional view depicts anti-mold flash features 412 formed over a mountable substrate 416 preferably including an extension portion 424 and a dam structure 436 adjacent to the extension portion 424.

A package encapsulation 410, such as an epoxy molding compound, includes the anti-mold flash features 412 at the innermost portions of a recess 404. The anti-mold flash features 412 cover a portion of the mountable substrate 416 exposed by the recess 404. The dam structure 436 constrains the extension portion 424 of the package encapsulation 410 without covering or contaminating the exposed portions of contact pads 418 of the mountable substrate 416. The dam structure 436 may be formed from dispensing or printing an encapsulating layer, or from a build-up of solder mask layer of the mountable substrate 416 and formed above a first surface 414 of the mountable substrate 416. The dam structure 436 is exposed in the recess 404. The dam structure 436 may protect the mountable substrate 416 during the molding process by providing a cushioned stop of the mold chase (not shown).

The package encapsulation 410 may provide the recess 404 with a sloped portion 420 continuing to the extension portion 424. The extension portion 424 is formed above the first surface 414 of the mountable substrate 416 at the bottom portion of the recess 404. The extension portion 424 has an extension width from the bottom portion of the recess 404.

An integrated circuit device 406 preferably mounts over a mountable integrated circuit package system 402 and within the recess 404. The mountable integrated circuit package system 402 includes the mountable substrate 416 and the dam structure 436. The mountable integrated circuit package system 402 has structural similarities to the mountable integrated circuit package system 102 of FIG. 2.

Electrical connectors 422 have a connector height 434 above the mountable substrate 416. The package encapsulation 410 adjacent to the recess 404 has a recess height 432 above the mountable substrate 416. The recess height 432 may be greater than the connector height 434. For illustrative purposes, the integrated circuit package-on-package system 400 is shown having the recess height 432 greater than the connector height 434, although it is understood that the recess height 432 may not be greater than the connector height 434. For example, the recess height 432 may be less than the connector height 434 with the integrated circuit device 406 extending beyond the recess 404. The extension portion 424 has an extension height above the mountable substrate 416. An extension height 428 is less than the connector height 434 such that the anti-mold flash features 412 do not impede connections between the integrated circuit device 406 and the mountable substrate 416.

For illustrative purposes, the anti-mold flash features 412 having the extension portion 424 and the dam structure 436 are shown having a single stepped configuration, although it is understood that the anti-mold flash features 412 may have different configurations. For example, the anti-mold flash features 412 may be formed in a multi-stepped configuration. Further, the anti-mold flash features 412 may have the different configurations throughout the boundary of the package encapsulation 410 in the recess 404. Moreover, the anti-mold flash features 412 may be formed in multiple locations.

It has been discovered that the anti-mold flash features prevent molding compound from bleeding over the mountable substrate during encapsulation process. The dam structure prevents the anti-mold flash features from inadvertently over-extending over the mountable substrate. The dam structure may also function as seals for the mold chase (not shown) during the molding process.

Figure 5:
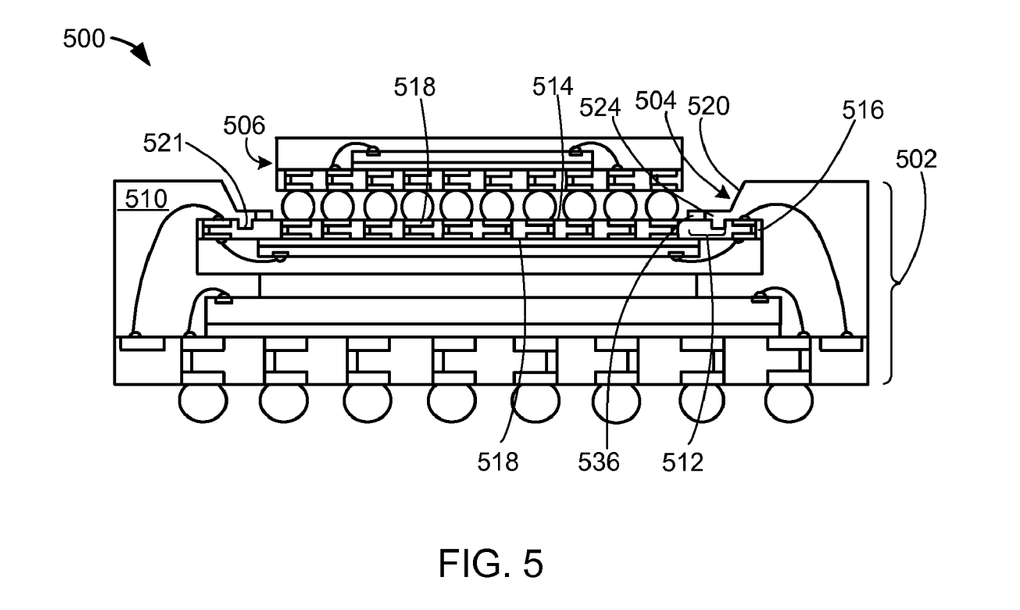
FIG. 5 is a cross-sectional view of an integrated circuit package-on-package system exemplified by the top view of FIG. 1 in a third embodiment of the present invention.

Referring now to FIG. 5, therein is shown a cross-sectional view of an integrated circuit package-on-package system 500 exemplified by the top view of FIG. 1 in the third embodiment of the present invention. The integrated circuit package-on-package system 500 includes structural similarities to the integrated circuit package-on-package system 100 of FIG. 2 and to the integrated circuit package-on-package system 400 of FIG. 4. The cross-sectional view depicts anti-mold flash features 512 include an extension portion 524 formed above and in grooves 521 of a mountable substrate 516 and a dam structure 536 formed above the mountable substrate 516 adjacent to the extension portion 524.

A package encapsulation 510, such as an epoxy molding compound, includes the extension portion 524 of the anti-mold flash features 512 at the innermost portions of a recess 504. The anti-mold flash features 512 cover a portion of the mountable substrate 516 exposed by the recess 504 without covering or contaminating the exposed portions of contact pads 518 of the mountable substrate 516.

The package encapsulation 510 may provide the recess 504 with a sloped portion 520 continuing to the extension portion 524. The extension portion 524 is formed above and below a first surface 514 of the mountable substrate 516 at the bottom portion of the recess 504. The extension portion 524 has an extension width from the bottom portion of the recess 504. The dam structure 536 may be formed from dispensing or printing an encapsulating layer, or from a build-up of solder mask layer of the mountable substrate 516 and formed above the first surface 514 of the mountable substrate 516 adjacent to the extension portion 524. The dam structure 536 is exposed in the recess 504.

An integrated circuit device 506 preferably mounts over a mountable integrated circuit package system 502 and within the recess 504. The mountable integrated circuit package system 502 includes the mountable substrate 516 and the dam structure 536. The mountable integrated circuit package system 502 has structural similarities to the mountable integrated circuit package system 102 of FIG. 2 and the mountable integrated circuit package system 402 of FIG. 4.

For illustrative purposes, the anti-mold flash features 512 having the extension portion 524 and the dam structure 536 are shown having a single stepped configuration, although it is understood that the anti-mold flash features 512 may have different configurations. For example, the anti-mold flash features 512 may be formed in a multi-stepped configuration. Another example, the anti-mold flash features 512 may have the different configurations throughout the boundary of the package encapsulation 510 in the recess 504. Moreover, the anti-mold flash features 512 may be formed in multiple locations As mentioned earlier, the dam structure 536 may provide a cushioning effect for the clamping force during molding process, thus prevents damaging the electrical layers of the inverted package or interposer. The extension portion 524 may provide mold locking functions so as to improve the mold adhesion between the molding compound and interposer edges.

Figure 6:
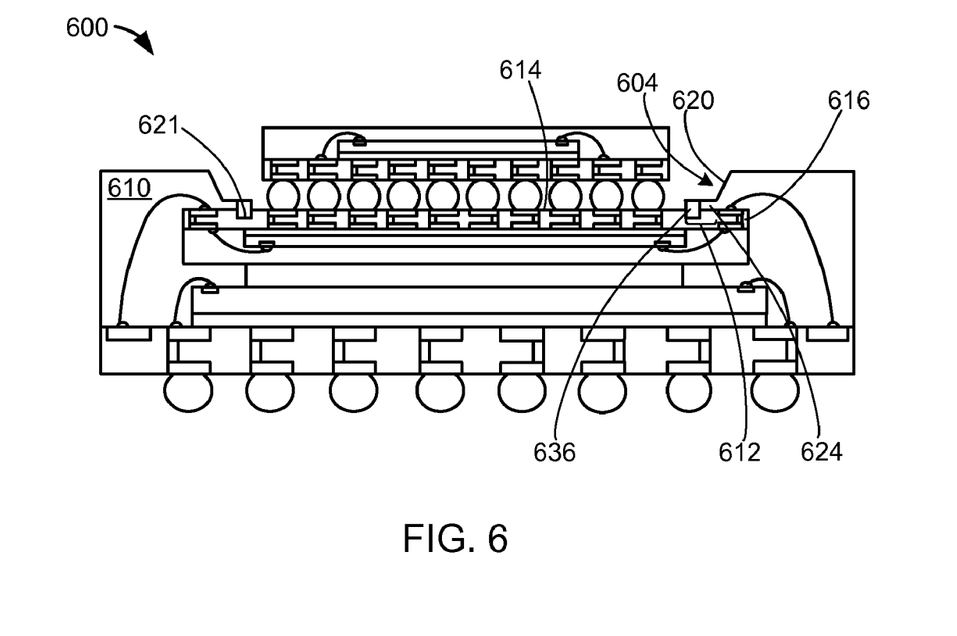
FIG. 6 is a cross-sectional view of an integrated circuit package-on-package system exemplified by the top view of FIG. 1 in a fourth embodiment of the present invention.

Referring now to FIG. 6, therein is shown a cross-sectional view of an integrated circuit package-on-package system 600 exemplified by the top view of FIG. 1 in the fourth embodiment of the present invention. The integrated circuit package-on-package system 600 includes structural similarities to the integrated circuit package-on-package system 100 of FIG. 2 and the integrated circuit package-on-package system 400 of FIG. 4. The cross-sectional view depicts anti-mold flash features 612 preferably including an extension portion 624 formed above a mountable substrate 616 and a dam structure 636 formed above and within grooves 621 of the mountable substrate 616.

A package encapsulation 610 includes the anti-mold flash features 612 at the innermost portions of a recess 604. The anti-mold flash features 612 cover a portion of the mountable substrate 616, such as laminated substrate or a redistribution structure, exposed by the recess 604. The package encapsulation 610 may provide the recess 604 with a sloped portion 620 continuing to the extension portion 624. The extension portion 624 is formed above a first surface 614 of the mountable substrate 616 at the bottom portion of the recess 604.

The dam structure 636 may be formed from dispensing or printing an encapsulating layer over and in the grooves 621. The dam structure 636 extends above the first surface 614 of the mountable substrate 616. The dam structure 636 is adjacent to the extension portion 624 and is exposed in the recess 604. The dam structure 636 may provide a cushioning effect for the clamping force during molding process, thus prevents damaging the electrical layers of the inverted package or interposer.

Figure 7:
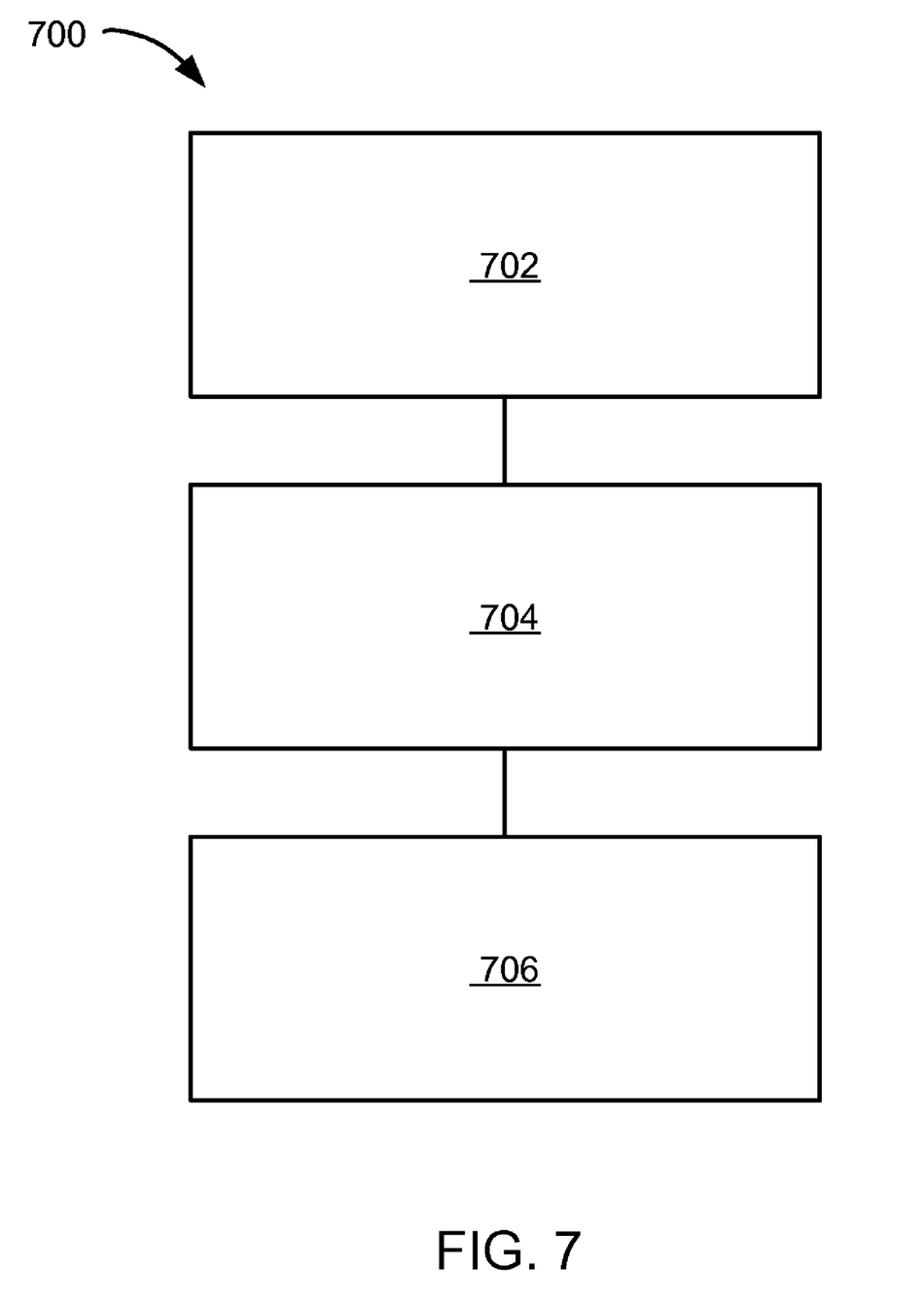
FIG. 7 is a flow chart of an integrated circuit package-on-package system for manufacturing of the integrated circuit package-on-package system in an embodiment of the present invention.

Referring now to FIG. 7, therein is shown a flow chart of an integrated circuit package-on-package system 700 for manufacturing the integrated circuit package-on-package system 100 in an embodiment of the present invention. The system 700 includes mounting an integrated circuit package system having a mountable substrate over a package substrate with the mountable substrate having a mold structure in a block 702; forming a package encapsulation having a recess over the package substrate and the integrated circuit package system including forming an anti-mold flash feature with an extension portion of the package encapsulation and constrained by the mold structure at the bottom of the recess, and partially exposing the mountable substrate in the recess with the anti-mold flash feature formed with the mold structure in a block 704; and mounting an integrated circuit device over the mountable substrate in the recess in a block 706.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package-on-package system of the present invention furnishes important and heretofore unknown and unavailable solutions, capabilities, and functional aspects for improving yield, increasing reliability, and reducing cost of circuit system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing an integrated circuit package-on-package system comprising:
   mounting an integrated circuit package system having a mountable substrate over a package substrate with the mountable substrate having a mold structure;
   forming a package encapsulation having a recess over the package substrate and the integrated circuit package system including:
      forming an anti-mold flash feature with an extension portion of the package encapsulation abutted to a non-horizontal side of the mountable substrate at the bottom of the recess, and
      partially exposing the mountable substrate in the recess with the anti-mold flash feature formed with the mold structure; and
   mounting an integrated circuit device over the mountable substrate in the recess.

2. The method as claimed in claim 1 wherein:
   mounting the integrated circuit package system includes:
      providing the mountable substrate with a contact pad;
   forming the package encapsulation having the recess includes:
      exposing the contact pad in the recess;
      preventing contamination from the package encapsulation over the contact pad with the anti-mold flash feature; and
   mounting the integrated circuit device over the mountable substrate in the recess includes:
      connecting the integrated circuit device and the contact pad.

3. The method as claimed in claim 1 wherein:
   mounting the integrated circuit package system having the mountable substrate with the mold structure includes:
      providing the mountable substrate having a groove; and
   forming the anti-mold flash feature having the extension portion of the package encapsulation and constrained by the mold structure includes:
      filling the groove with the extension portion.

4. The method as claimed in claim 1 wherein:
   mounting the integrated circuit package system having the mountable substrate with the mold structure includes:
      providing the mountable substrate having a dam structure; and
   forming the anti-mold flash feature having the extension portion of the package encapsulation and constrained by the mold structure includes:
      forming the extension portion adjacent to the dam structure.

5. The method as claimed in claim 1 wherein:
   mounting the integrated circuit package system having the mountable substrate with the mold structure includes:
      providing the mountable substrate having both a dam structure extended therefrom and a groove; and
   forming the anti-mold flash feature having the extension portion of the package encapsulation and constrained by the mold structure includes:
      forming the extension portion adjacent to the dam structure and in the groove.

6. A method for manufacturing an integrated circuit package-on-package system comprising:
   mounting an integrated circuit package system having a mountable substrate over a package substrate with the mountable substrate having a mold structure and a contact pad;
   forming a package encapsulation having a recess over the package substrate and the integrated circuit package system including:
      forming an anti-mold flash feature with an extension portion of the package encapsulation abutted to a non-horizontal side of the mountable substrate at the bottom of the recess,
      partially exposing the contact pad of the mountable substrate in the recess with the anti-mold flash feature formed with the mold structure, and
      preventing contamination from the package encapsulation over the contact pad with the anti-mold flash feature; and
   mounting an integrated circuit device over the mountable substrate in the recess.

7. The method as claimed in claim 6 wherein mounting the integrated circuit package system having the mountable substrate over the package substrate includes mounting the integrated circuit package system over an integrated circuit with the integrated circuit over the package substrate.

8. The method as claimed in claim 6 wherein:
   mounting the integrated circuit package system having the mountable substrate with the mold structure includes:
      providing the mountable substrate with a dam structure extended therefrom with the dam structure comprised of a solder mask material of the mountable substrate; and
   forming the anti-mold flash feature having the extension portion of the package encapsulation and constrained by the mold structure includes:
      forming the extension portion to the dam structure.

9. The method as claimed in claim 6 wherein:
   mounting the integrated circuit package system having the mountable substrate with the mold structure includes:
      providing the mountable substrate with a dam structure extended therefrom with the dam structure comprised of an encapsulation material of the mountable substrate; and
   forming the anti-mold flash feature having the extension portion of the package encapsulation and constrained by the mold structure includes:
      forming the extension portion adjacent to the dam structure.

10. The method as claimed in claim 6 further comprising attaching an external interconnect with the package substrate at an opposing side to the integrated circuit package-on-package system.

11. An integrated circuit package-on-package system comprising:
   a package substrate;
   an integrated circuit package system having a mountable substrate over the package substrate with the mountable substrate having a mold structure;
   a package encapsulation having a recess over the package substrate and the integrated circuit package-on-package system including:

an anti-mold flash feature having an extension portion of the package encapsulation abutted to a non-horizontal side of the mountable substrate at the bottom of the recess, and the mountable substrate partially exposed in the recess with the anti-mold flash feature formed with the mold structure; and an integrated circuit device mounted over the mountable substrate in the recess.

12. The system as claimed in claim 11 wherein:
the mountable substrate includes a contact pad exposed in the recess and the anti-mold flash feature for preventing contamination from the package encapsulation over the contact pad; and the integrated circuit device is connected to the contact pad.

13. The system as claimed in claim 11 wherein:
the mold structure includes a groove; and
the anti-mold flash feature having the extension portion constrained by the mold structure includes the extension portion in the groove.

14. The system as claimed in of claim 11 wherein:
the mold structure includes a dam structure; and
the anti-mold flash feature having the extension portion constrained by the mold structure includes the extension portion adjacent to the dam structure.

15. The system as claimed in claim 11 wherein:
the mold structure includes a dam structure extended therefrom and a groove; and
the anti-mold flash feature having the extension portion constrained by the mold structure includes the extension portion adjacent to the dam structure and in the groove.

16. The system as claimed in claim 11 wherein:
the mountable substrate includes a contact pad exposed in the recess and the anti-mold flash feature for preventing contamination from the package encapsulation over the contact pad;

the package encapsulation includes a sloped portion in the recess to the anti-mold flash feature; and the integrated circuit device includes an electrical connector connected with the contact pad.

17. The system as claimed in claim 16 wherein the integrated circuit package system having the mountable substrate over the package substrate includes the integrated circuit package system over an integrated circuit with the integrated circuit over the package substrate.

18. The system as claimed in of claim 16 wherein:
the mold structure includes a dam structure comprised of a solder mask material of the mountable substrate; and
the anti-mold flash feature having the extension portion constrained by the mold structure includes the extension portion adjacent to the dam structure.

19. The system as claimed in claim 16 wherein:
the mold structure includes a dam structure comprised of an encapsulation material of the mountable substrate; and
the anti-mold flash feature having the extension portion constrained by the mold structure includes the extension portion adjacent to the dam structure.

20. The system as claimed in claim 16 further comprising an external interconnect attached with the package substrate at an opposing side to the integrated circuit package system.

* * * * *